(12) United States Patent
Ishishita

(10) Patent No.: US 7,746,031 B2
(45) Date of Patent: Jun. 29, 2010

(54) MONITORING DEVICE FOR POWER SUPPLY SYSTEM

(75) Inventor: Teruo Ishishita, Nishikamo-gun (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 472 days.

(21) Appl. No.: 11/884,009

(22) PCT Filed: Feb. 23, 2006

(86) PCT No.: PCT/JP2006/303931

§ 371 (c)(1),
(2), (4) Date: Aug. 9, 2007

(87) PCT Pub. No.: WO2006/098157

PCT Pub. Date: Sep. 21, 2006

(65) Prior Publication Data

US 2008/0129249 A1      Jun. 5, 2008

(30) Foreign Application Priority Data

Mar. 17, 2005   (JP)   .............................. 2005-077284

(51) Int. Cl.
   *H02J 7/00*       (2006.01)
   *G01N 27/416*     (2006.01)

(52) U.S. Cl. .................. 320/132; 320/116; 320/136; 324/427

(58) Field of Classification Search .................. 320/103, 320/104, 116, 119, 132, 134, 136; 324/426, 324/427, 433, 434
   See application file for complete search history.

(56) References Cited

U.S. PATENT DOCUMENTS 4,992,340 A     2/1991  Tidwell et al.
5,530,337 A     6/1996  Yamamoto
6,211,681 B1 *  4/2001  Kagawa et al. ............... 324/426
6,812,670 B2 * 11/2004  Minamiura et al. .......... 320/116
2002/0195996 A1 * 12/2002 Nakatsuji .................... 320/127
2003/0137277 A1 *  7/2003  Mori et al. .................... 320/132

FOREIGN PATENT DOCUMENTS

| JP | A-1-129713   | 5/1989 |
| JP | A-9-74794    | 3/1997 |
| JP | A-11-041706  | 2/1999 |
| JP | A 11-234801  | 8/1999 |
| JP | A-2000-206221| 7/2000 |
| JP | A 2000-209702| 7/2000 |
| JP | A 2002-084669| 3/2002 |

OTHER PUBLICATIONS

Japanese Office Action issued on Mar. 9, 2010 for Japanese Application No. 077284/2005 (with translation).

* cited by examiner

*Primary Examiner*—Patrick J Assouad
*Assistant Examiner*—M'Baye Diao
(74) *Attorney, Agent, or Firm*—Oliff & Berridge, PLC

(57) ABSTRACT

A battery monitoring unit and sensors are supplied with a common operating supply voltage to operate. Detection values from sensors are sent to a control circuit by the battery monitoring unit. The control circuit monitors the operating supply voltage using a voltage sensor and additionally determines whether or not the detection values from the sensors before the relay connection falls within a normal range to more accurately detect a power supply reduction abnormality of the battery monitoring unit. Therefore, abnormalities can be detected accurately when the sensor and the battery monitoring unit provided for the secondary battery cannot operate normally due to a reduced operating supply voltage.

12 Claims, 3 Drawing Sheets

MONITORING DEVICE FOR POWER SUPPLY SYSTEM

TECHNICAL FIELD

The present invention relates to a monitoring device for a power supply system, and more particularly to a monitoring device for use in a power supply system supplying power from a secondary battery to a load through a relay.

BACKGROUND ART

A variety of power supply systems for supplying power from a secondary battery to a load are used in hybrid cars and others. In such a power supply system, it is necessary to properly detect abnormalities in a secondary battery.

In this respect, for example, Japanese Patent Laying-Open No. 2002-084669 (referred to as Patent Document 1 hereinafter) discloses a battery pack configured such that a plurality of cell groups each configured to include a plurality of electric cells connected in series are connected in series. For this battery pack, cell-state monitoring means for monitoring a state of each electric cell is provided to allow sensing of abnormalities for each electric cell. In particular, in the configuration disclosed in Patent Document 1, power supply to the cell-state monitoring means is at least partially stopped during a period of time in which the output from the cell-state monitoring means is not referred to by the higher-level abnormality monitoring means, so that power consumption by the cell-state monitoring means can be reduced.

Furthermore, Japanese Patent Laying-Open No. 11-234801 (referred to as "Patent Document 2" hereinafter) discloses a battery ECU detecting a battery abnormal condition based on voltage data or temperature data. In this battery ECU, when any abnormality occurs in a sensor itself that detects the abnormality of the battery, a ventilating fan or an in/out switching valve is switched appropriately so that gases produced from the battery can quickly be exhausted from the car even when the battery abnormal condition takes place repeatedly.

However, the configuration disclosed in Patent Document 1 is unable to sense the abnormality of the cell-state monitoring means itself that monitors the abnormality of the secondary battery. Therefore, during the abnormal condition of the cell-state monitoring means, the secondary battery may not be controlled properly due to wrong information.

On the other hand, in the configuration disclosed in Patent Document 2, as for a sensor determining voltage data or temperature data, a failure in the sensor itself is sensed at the time of hardware failures such as a disconnection or a short-circuit. However, even in the absence of hardware failures such as a disconnection or a short-circuit, the sensor output value (detection value) or the operation of the battery monitoring unit may sometimes become abnormal due to reduction of an operating supply voltage. When an output value from the sensor or the battery monitoring unit is used as a normal value for control or the like without sensing such abnormalities, the state of the secondary battery cannot be controlled accurately, thereby possibly causing an abnormal operation of the power supply system.

DISCLOSURE OF THE INVENTION

It is an object of the present invention to provide a monitoring device for a power supply system that allows for accurate abnormality detection when a sensor and a battery monitoring unit provided for a secondary battery cannot perform normal operations due to reduction of an operating supply voltage.

A monitoring device for a power supply system in accordance with the present invention monitors a power supply system including a secondary battery, a load receiving power supply from the secondary battery, and a relay arranged between the secondary battery and the load. The monitoring device includes a sensor, a battery monitoring unit, a first sensing portion, a second sensing portion, and an abnormality sensing portion. The sensor is provided to measure the quantity of state of the secondary battery. The battery monitoring unit is provided with an operating supply voltage common to the sensor and operate to monitor a state of the secondary battery. The first sensing portion senses that a measurement value obtained by the sensor falls outside a prescribed normal range in a state before connection of the relay. The second sensing portion senses that the operating supply voltage is below a prescribed operation guaranteed value of the battery monitoring unit. The abnormality sensing portion senses an abnormality of the battery monitoring unit when the first sensing portion senses that the measurement value obtained by the sensor falls outside the normal range before connection of the relay and when the second sensing portion senses that the operating supply voltage is below the operation guaranteed value.

In accordance with the monitoring device for a power supply system as described above, an abnormality of the battery monitoring unit is sensed based on that the sensor output falls outside a normal range before the relay connection, in a state before the relay connection, and when the operating supply voltage is below the operation guaranteed value. Therefore, even before the relay connection when power is not supplied from the secondary battery, the operating supply voltage reduction abnormality of the battery monitoring unit including the sensor can be sensed. Accordingly, power supply is not started by connecting the relay in a state in which the sensor and the battery monitoring unit cannot operate normally due to the reduced operating supply voltage, thereby preventing an abnormal operation of the power supply system based on an erroneous sensor output. Moreover, as compared with a configuration in which an abnormality of the battery monitoring unit is sensed only based on monitoring the operating supply voltage, erroneous abnormality detection caused by a momentary variation in operating supply voltage can be prevented.

Preferably, in the monitoring device for a power supply system in accordance with the present invention, the second sensing portion senses that the operating supply voltage is below the operation guaranteed value when the operating supply voltage is below the operation guaranteed value continuously for a prescribed period of time.

In accordance with the monitoring device for a power supply system as described above, even when the operating supply voltage of the battery monitoring unit is shared with other equipment and the operating supply voltage is temporarily reduced, an abnormality of the battery monitoring unit is not detected erroneously. Therefore, the precision of detecting an abnormality of the battery monitoring unit can be improved.

Preferably, in the monitoring device for a power supply system in accordance with the present invention, the abnormality sensing portion senses an abnormality of the battery monitoring unit, after connection of the relay, when the second sensing portion senses that the operating supply voltage is below the operation guaranteed value continuously for a prescribed period of time.

In accordance with the monitoring device for a power supply system as described above, even after the relay connection, the operating supply voltage reduction abnormality can be detected.

Preferably, the sensor is a current sensor measuring an input/output current of the secondary battery.

In accordance with the monitoring device for a power supply system as described above, a current sensor of which measurement value is in the vicinity of zero before the relay connection is used to sense an abnormality of the battery monitoring unit, so that the operating supply voltage reduction abnormality before relaying can be sensed more accurately.

Preferably, the monitoring device for a power supply system in accordance with the present invention further includes an abnormality processing portion prohibiting connection by the relay when the abnormality sensing portion senses an abnormality of the battery monitoring unit.

In accordance with the monitoring device for a power supply system as described above, the connection between the secondary battery and the load through the relay is prohibited when an abnormality of the battery monitoring unit is sensed, thereby preventing an abnormal operation of the power supply system caused by an erroneous sensor output or battery operation output.

Preferably, the monitoring device for a power supply system in accordance with the present invention further includes abnormality processing portion halting control based on the measurement value of the sensor when the abnormality sensing portion senses an abnormality of the battery monitoring unit.

In accordance with the monitoring device for a power supply system as described above, control based on the measurement value of the sensor is halted when an abnormality of the battery monitoring unit is sensed. Therefore, an abnormal operation of the power supply system can be prevented that is caused by the control based on an abnormal output from the sensor resulting from reduction of the operating supply voltage.

Therefore, in the monitoring device for a power supply system in accordance with the present invention, abnormality detection can be performed accurately when the sensor and the battery monitoring unit provided for the secondary battery cannot operate normally due to the reduction of the operating supply voltage.

BEST MODES FOR CARRYING OUT THE INVENTION

Figure 1:
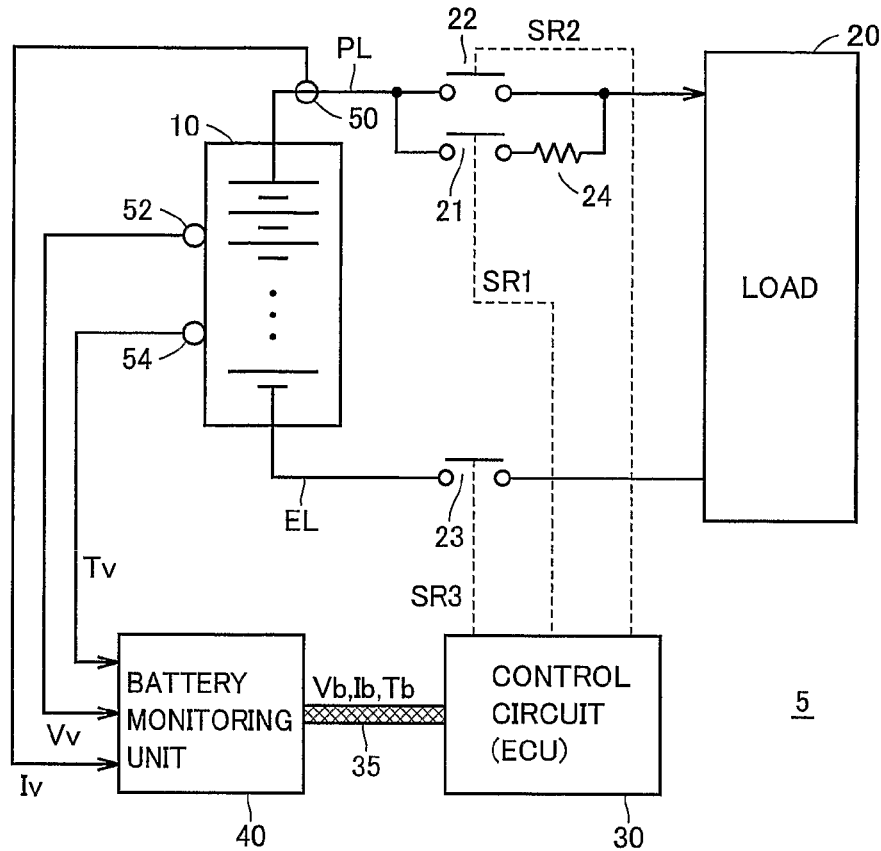
FIG. 1 is a schematic block diagram showing an exemplary configuration of a power supply system that is monitored by a monitoring device in accordance with an embodiment of the present invention.

In the following, an embodiment of the present invention will be described in detail with reference to the figures. It is noted that in the following the same or corresponding parts in the figures will be denoted with the same reference characters and the detailed description will not basically be repeated.

FIG. 1 is a schematic block diagram showing an exemplary configuration of a power supply system that is monitored by a monitoring device in accordance with an embodiment of the present invention.

Referring to FIG. 1, a power supply system 5 includes a secondary battery 10, a load 20, relays 21-23 provided between secondary battery 10 and load 20, a control circuit (ECU: Electronic Control Unit) 30, a battery monitoring unit 40, and sensors 50, 52, 54 provided for secondary battery 10.

Secondary battery 10 is configured by connecting a plurality of rechargeable electric cells. In the embodiment of the present invention, the form of secondary battery 10 is not specifically limited, and the present invention is applicable to any of lead-acid batteries, nickel metal hydride secondary batteries, lithium-ion secondary batteries, and the like.

Secondary battery 10 has its positive electrode connected to a power supply line PL and has its negative electrode connected to a ground line EL. Relay 21 is arranged to allow power supply line PL to be connected to load 20 through an inrush current limiting resistor 24. Relay 22 is provided in parallel with relay 21 and inrush current limiting resistor 24 and is arranged to allow power supply line PL and load 20 to be connected with each other not through inrush current limiting resistor 24. Relay 23 is connected between ground line EL and load 20.

Relays 21-23 are turned on/off in response to relay control signals SR1-SR3, respectively. At a state before start-up of load 20, that is, before the relay connection, each of relays 21-23 is turned off, so that secondary battery 10 is electrically cut off from load 20.

On start-up of load 20, relays 21 and 23 are turned on, so that power is supplied from secondary battery 10 to load 20 through inrush current limiting resistor 24. Thereafter, when a prescribed period of time has passed after the start-up of load 20, relay 22 is turned on in place of relay 21. Relay 22 and relay 23 are turned on, so that electricity is supplied from secondary battery 10 to load 20 while bypassing inrush current limiting resistor 24. In other words, after the relay connection, relay 21 or 22 and relay 23 are turned on, so that current is supplied from secondary battery 10 to load 20. On the other hand, control circuit 30 turns off each of relays 21-23 by means of relay control signals SR1-SR3 at the time of abnormality sensing or the stoppage of load 20, so that current supply from secondary battery 10 to load 20 can be stopped.

Secondary battery 10 is provided with current sensor 50, voltage sensor 52, and temperature sensor 54. Current sensor 50 outputs an output voltage Iv according to passing current through power supply line PL, that is, an input/output current Ib (also referred to as battery current Ib hereinafter) of secondary battery 10. Voltage sensor 52 outputs an output voltage Vv according to a battery voltage Vb that is the output voltage of secondary battery 10. Temperature sensor 54 is attached to a prescribed part of secondary battery 10 to output an output voltage Tv according to a temperature at the attached part (battery temperature Tb).

Battery monitoring unit 40 receives output voltages Iv, Vv, Tv from sensors 59, 52, 54 to output battery current Ib, battery voltage Vb, and battery temperature Tb, each of which is the quantity of state of secondary battery 10. These quantities of state are output from battery monitoring unit 40 as digital signals to be transmitted to control circuit 30 through a communication line 35.

Battery monitoring unit 40 may be configured to additionally include a function of sensing a failure of secondary battery 10. For example, battery monitoring unit 40 is configured to output a signal (not shown) for indicating hardware failures (such as a disconnection or a short-circuit) from sensors 50, 52, 54 to control circuit 30 through communication line 35. Alternatively, battery monitoring unit 40 is configured to measure a gas pressure of an electric cell using a not-shown pressure sensor and transmit the measurement result to control circuit 30 through communication line 35.

Figure 2:
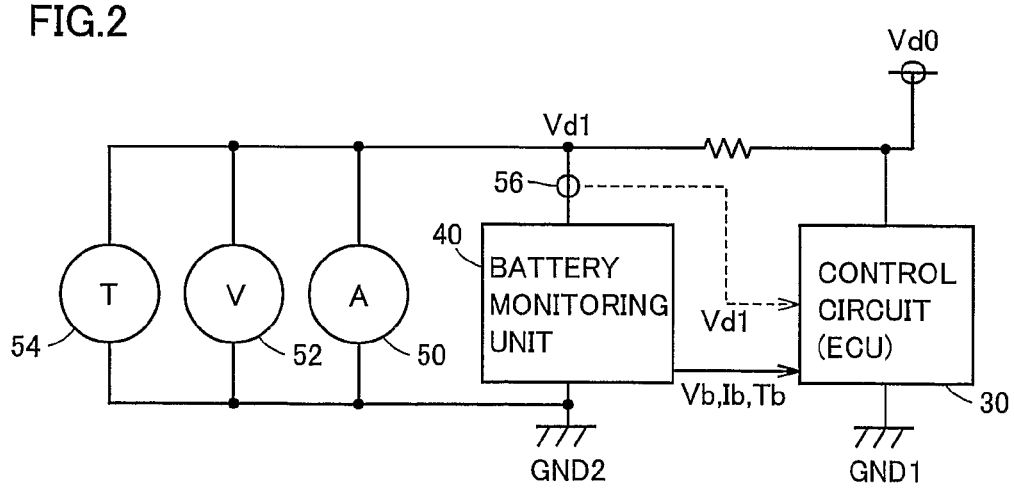
FIG. 2 is a diagram illustrating a configuration of power supply to a battery monitoring unit and each sensor shown in FIG. 1.

FIG. 2 is a diagram illustrating a configuration of power supply to battery monitoring unit 40 and sensors 50, 52, 54 shown in FIG. 1.

Referring to FIG. 2, sensors 50, 52, 54 and battery monitoring unit 40 operate in response to a common operating supply voltage. The operating supply voltage is supplied from an operating power supply (Vd0) of control circuit (ECU) 30. It is noted that voltage sensor 56 detects an operating supply voltage Vd1 of sensors 50, 52, 54 and battery monitoring unit 40. Operating supply voltage Vd1 becomes lower than Vd0 because of a voltage drop at parasitic resistance of the power supply line. Control circuit (ECU) 30 can continuously monitor operating supply voltage Vd1 with a detection value obtained from voltage sensor 56.

Sensors 50, 52, 54 and battery monitoring unit 40 are each designed to share a ground (GND2), which is different from a ground (GND1) for control circuit (ECU) 30.

The operation guaranteed value of battery monitoring unit 40 is predetermined. Basically, control circuit 30 senses reduction of the operating supply voltage of the battery monitoring unit when operating supply voltage Vd1 of battery monitoring unit 40 is below an operation guaranteed voltage (Vk).

However, for example, hybrid cars use an auxiliary battery as the operating power supply for control circuit (ECU) 30, which is also used as the power supply for the other auxiliary equipment. Therefore, in operations of such auxiliary equipment, supply voltage Vd0 from the operating power supply is temporarily reduced, and operating supply voltage Vd1 may also be reduced accordingly. Therefore, if the detection of abnormalities of battery monitoring unit 40 is performed only based on operating supply voltage Vd1, it is likely that abnormalities are erroneously detected.

On the other hand, since each sensor operates in response to operating supply voltage Vd1 common to battery monitoring unit 40, the reduction of operating supply voltage Vd1 also affects the sensor output.

Figure 3:
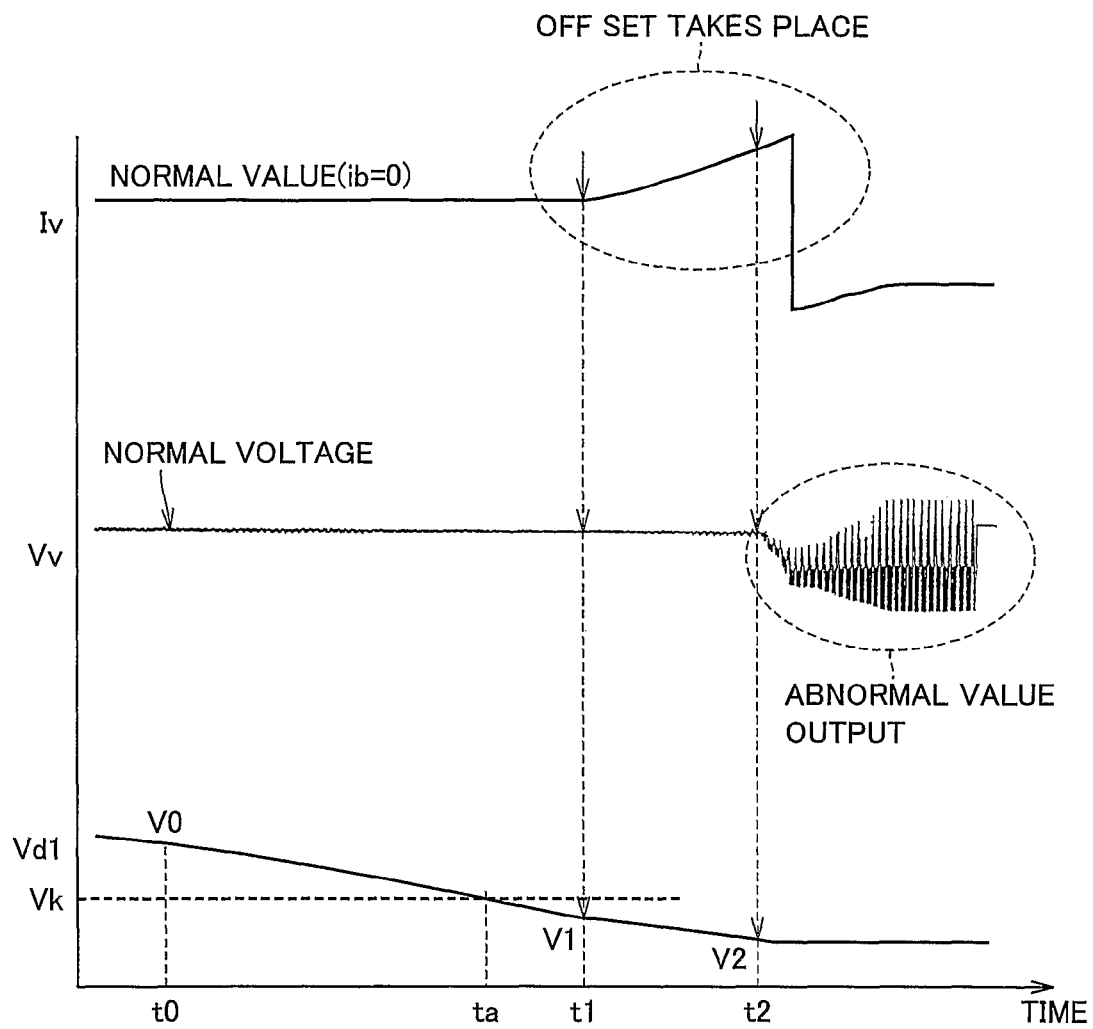
FIG. 3 is a chart illustrating an abnormal operation of a sensor in relation to reduction of an operating supply voltage.

FIG. 3 illustrates the abnormal operation of the sensor in relation to the reduction of the operating supply voltage.

FIG. 3 shows the experimental results of output variations of voltage sensor 52 and current sensor 50 with changing operating supply voltage Vd1 while each of relays 21-23 is kept off.

Referring to FIG. 3, operating supply voltage Vd1 is experimentally set to be gradually reduced over time. For example, operating supply voltage Vd1 is set to V0 higher than operation guaranteed voltage Vk at time t0, and is set to V1, V2 below operation guaranteed voltage Vk at times t1, t2.

At time ta, operating supply voltage Vd1 becomes below operation guaranteed voltage Vk. However, even in this state, current sensor 50 and voltage sensor 52 can operate normally. In other words, they output normal values similar to when Vd1>Vk. It is noted that the normal output values of voltage sensor 52 and current sensor 50 at the time of relay-off are: Ib=0 for current sensor 50; and battery voltage Vb for voltage sensor 52, which corresponds to an open-circuit voltage of secondary battery 10.

Thereafter, when operating supply voltage Vd1 is further reduced, the output value from current sensor 50 becomes abnormal (an offset takes place) in the region of Vd1<V1. Furthermore, the output from voltage sensor 52 becomes abnormal in the region of Vd1<V2.

In this manner, with the reduction of the operating supply voltage, the output of current sensor 50 or voltage sensor 52 also shows abnormality. In other words, the reduction of operating supply voltage Vd1 can also be sensed by monitoring whether or not the output values from these sensors are normal before the relay connection.

Figure 4:
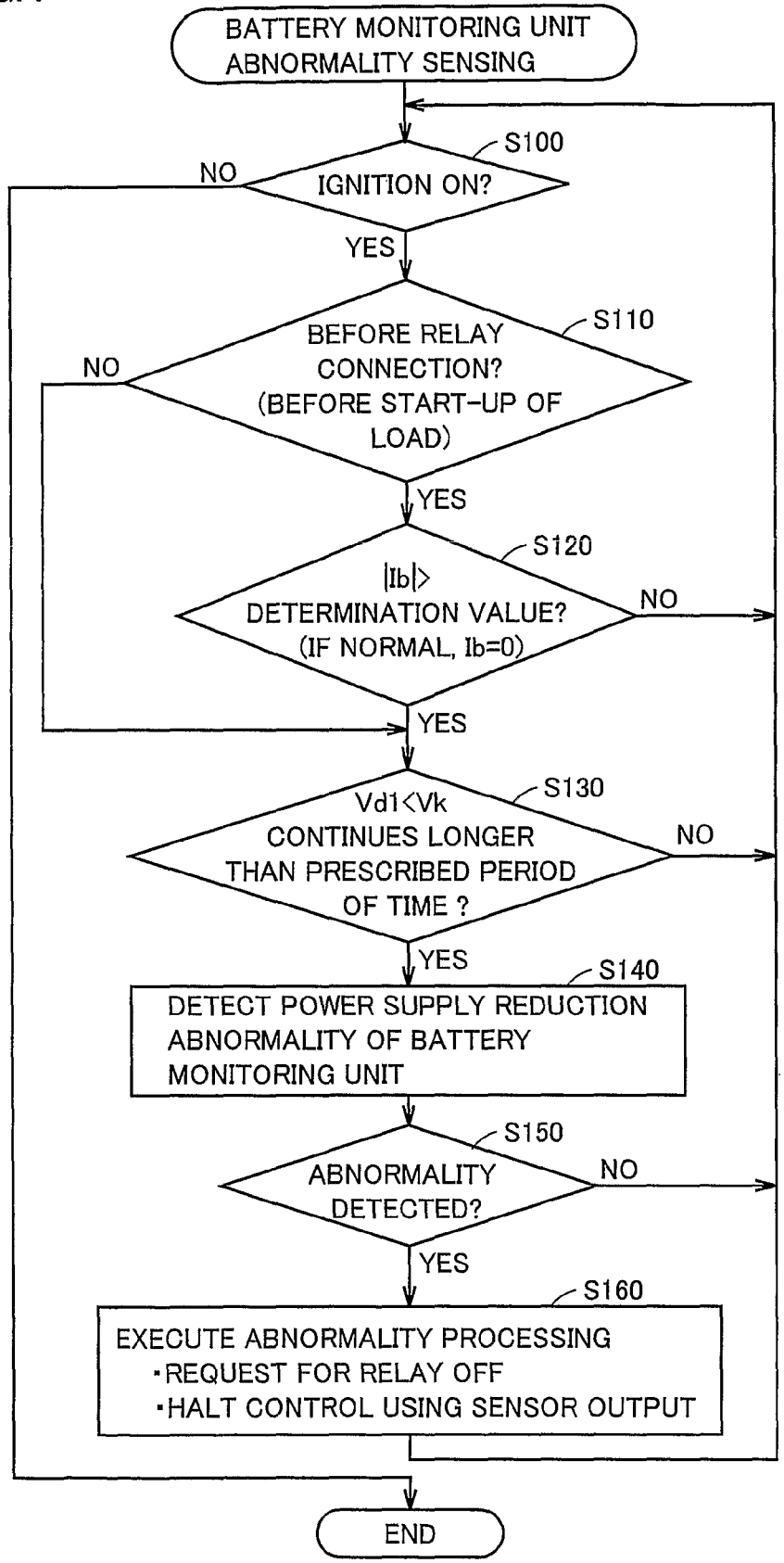
FIG. 4 is a flowchart illustrating sensing of abnormality of the battery monitoring unit by the monitoring device in accordance with the embodiment of the present invention.

Thus, the monitoring device for a power supply system in accordance with the embodiment of the present invention senses an abnormality of the battery monitoring unit according to the flowchart as shown in FIG. 4.

Referring to FIG. 4, control circuit (ECU) 30 determines whether or not an ignition switch is on at step S100, and it performs abnormality sensing processing at the following steps S110-S160 for a period of time during which the ignition switch is on (YES at step S100). On the other hand, when the ignition switch is off (NO at step S110), the abnormality sensing processing for the power supply monitoring unit ends.

At step S110, control circuit (ECU) 30 determines whether or not relays 21-23 have not yet been connected (are off), that is, whether or not load 20 has not yet been started.

Before the relay connection (YES at step S110), control circuit (ECCU) 30 determines whether or not the output from current sensor 50 is normal at step S120. Based on battery current Ib=0 before the relay connection, when the absolute value |Ib| of the detection value obtained from current sensor 50 is greater than a prescribed determination value, it is sensed that the output from current sensor 50 falls outside the normal range.

When the output from current sensor 50 falls outside the normal range (YES at step S120), control circuit (ECU) 30 determines whether or not operating supply voltage Vd1 of battery monitoring unit 40 is below operation guaranteed voltage Vk. Then, when Vd1<Vk continues longer than a prescribed period of time (YES at step S130), control circuit ECU) 30 senses that operating supply voltage Vd1 is below operation guaranteed voltage Vk to detect the power supply reduction abnormality of battery monitoring unit 40 (step S140).

On the other hand, after relay connection (NO at step S110), control circuit ECU) 30 performs the power supply reduction abnormality detection for battery monitoring unit 40 only at step S130. In other words, when Vd1<Vk continues longer than a prescribed period of time and the operating supply voltage of battery monitoring unit 40 is continuously reduced, the power supply reduction abnormality of the battery monitoring unit is detected (step S140).

When the power supply reduction abnormality of the battery monitoring unit is detected at step S140 (YES at step S150), control circuit ECU) 30 performs prescribed abnormality processing at step S160. The abnormality processing performed at step S160 includes a request to turn off relays 21-23 for cutting off secondary battery 10 from load 20, and a request to halt a variety of control (for example, control on charging/discharging secondary battery 10) based on the detection values of sensors 50, 52, 54.

Accordingly, the abnormal operation of power supply system 5 can be avoided that is caused by erroneous control operations based on the output from battery monitoring unit 40 (including the sensor output) in a state in which the operating supply voltage is reduced.

It is noted that when it is determined as NO at step S120 (|Ib0|<0), or when it is determined as NO at step S130 (operating supply voltage Vd1>operation guaranteed voltage Vk), the power supply reduction abnormality of battery monitoring unit 40 is not detected. The abnormality sensing processing at steps S110-S160 is repeatedly executed at prescribed intervals for a period of time during which the ignition is on (YES at step S100). Alternatively, in the flowchart in FIG. 4, step S130 may be executed before steps S110 and S120.

It is, noted that the correspondence between the flowchart shown in FIG. 4 and the configuration of the present invention is as follows: step S120 corresponds to "the first sensing means" in the present invention, and step S130 corresponds to "the second sensing means" in the present invention. Furthermore, step S140 corresponds to "the abnormality sensing means" in the present invention, and step S160 corresponds to "the abnormality processing means" in the present invention.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A monitoring device for a power supply system including a secondary battery, a load receiving power supply from said secondary battery, and a relay arranged between said secondary battery and said load, said monitoring device comprising:
   a sensor for measuring a quantity of state of said secondary battery;
   a battery monitoring unit supplied with an operating supply voltage common to said sensor and operating to monitor a state of said secondary battery;
   first sensing means for sensing that a measurement value obtained by said sensor falls outside a prescribed normal range in a state before connection of said relay;
   second sensing means for sensing that said operating supply voltage is below a prescribed operation guaranteed value of said battery monitoring unit; and
   abnormality sensing means for sensing an abnormality of said battery monitoring unit when said first sensing means senses that the measurement value obtained by said sensor falls outside said normal range before connection of said relay and when said second sensing means senses that said operating supply voltage is below said operation guaranteed value.

2. The monitoring device for a power supply system according to claim 1, wherein said second sensing means senses that said operating supply voltage is below said operation guaranteed value when said operating supply voltage is below said operation guaranteed value continuously for a prescribed period of time.

3. The monitoring device for a power supply system according to claim 1, wherein said abnormality sensing means includes means for sensing an abnormality of said battery monitoring unit, after connection of said relay, when said second sensing means senses that said operating supply voltage is below said operation guaranteed value continuously for a prescribed period of time.

4. The monitoring device for a power supply system according to claim 1, wherein said sensor is a current sensor measuring an input/output current of said secondary battery.

5. The monitoring device for a power supply system according to claim 1, further comprising abnormality processing means for prohibiting connection by said relay when said abnormality sensing means senses an abnormality of said battery monitoring unit.

6. The monitoring device for a power supply system according to claim 1, further comprising abnormality processing means for halting control based on the measurement value of said sensor when said abnormality sensing means senses an abnormality of said battery monitoring unit.

7. A monitoring device for a power supply system including a secondary battery, a load receiving power supply from said secondary battery, and a relay arranged between said secondary battery and said load, said monitoring device comprising:
   a sensor for measuring a quantity of state of said secondary battery;
   a battery monitoring unit supplied with an operating supply voltage common to said sensor and operating to monitor a state of said secondary battery;
   a first sensing portion sensing that a measurement value obtained by said sensor falls outside a prescribed normal range in a state before connection of said relay;
   a second sensing portion sensing that said operating supply voltage is below a prescribed operation guaranteed value of said battery monitoring unit; and
   an abnormality sensing portion sensing an abnormality of said battery monitoring unit when said first sensing portion senses that the measurement value obtained by said sensor falls outside said normal range before connection of said relay and when said second sensing portion senses that said operating supply voltage is below said operation guaranteed value.

8. The monitoring device for a power supply system according to claim 7, wherein said second sensing portion senses that said operating supply voltage is below said operation guaranteed value when said operating supply voltage is below said operation guaranteed value continuously for a prescribed period of time.

9. The monitoring device for a power supply system according to claim 7, wherein said abnormality sensing portion senses an abnormality of said battery monitoring unit when said second sensing portion senses that said operating supply voltage is below said operation guaranteed value continuously for a prescribed period of time after connection of said relay.

10. The monitoring device for a power supply system according to claim 7, wherein said sensor is a current sensor measuring an input/output current of said secondary battery.

11. The monitoring device for a power supply system according to claim 7, further comprising an abnormality processing portion prohibiting connection by said relay when said abnormality sensing portion senses an abnormality of said battery monitoring unit.

12. The monitoring device for a power supply system according to claim 7, further comprising an abnormality processing portion halting control based on the measurement value of said sensor when said abnormality sensing portion senses an abnormality of said battery monitoring unit.

* * * * *